US008291365B2

(12) United States Patent
He et al.

(10) Patent No.: US 8,291,365 B2
(45) Date of Patent: Oct. 16, 2012

(54) CONDITIONALLY ROUTING A PORTION OF AN INTEGRATED CIRCUIT DESIGN WITH A DIFFERENT PITCH TO OVERCOME A DESIGN RULE VIOLATION

(75) Inventors: Limin He, Saratoga, CA (US); So-Zen Yao, Fremont, CA (US); Wenyong Deng, San Jose, CA (US); Jing Chen, Fremont, CA (US); Liang-Jih Chao, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/327,226

(22) Filed: Jan. 6, 2006

(65) Prior Publication Data

US 2006/0190897 A1    Aug. 24, 2006

Related U.S. Application Data

(62) Division of application No. 10/071,862, filed on Feb. 7, 2002, now Pat. No. 7,036,101.

(60) Provisional application No. 60/271,515, filed on Feb. 26, 2001.

(51) Int. Cl.
  *G06F 17/50* (2006.01)

(52) U.S. Cl. ............... 716/129; 716/126; 716/130

(58) Field of Classification Search .......... 716/2, 7, 716/11–14, 126, 129, 130
See application file for complete search history.

(56) References Cited

U.S. PATENT DOCUMENTS

| | | | |
|---|---|---|---|
| 4,612,618 A | 9/1986 | Pryor et al. | |
| 4,688,072 A | 8/1987 | Heath et al. | |
| 5,353,235 A * | 10/1994 | Do et al. | 716/130 |
| 5,355,322 A | 10/1994 | Yamashita et al. | |
| 5,583,788 A | 12/1996 | Kuribayashi | |
| 5,629,860 A | 5/1997 | Jones et al. | |
| 5,636,129 A | 6/1997 | Her | |
| 5,640,327 A | 6/1997 | Ting | |
| 5,761,664 A | 6/1998 | Sayah et al. | |
| 5,793,643 A | 8/1998 | Cai | |
| 5,798,936 A | 8/1998 | Cheng | |
| 5,841,664 A | 11/1998 | Cai et al. | |

(Continued)

FOREIGN PATENT DOCUMENTS

JP    62186351    8/1987

(Continued)

OTHER PUBLICATIONS

Melvin A. Breuer, "Design Automation of Digital Systems," vol. 1, Theory and Techniques, 1972 Prentice-Hall, pp. 173-333.

Mark D. Birnbaum, "Essential eletronic Design Automation (EDA)," 2004 Pearson Education, Inc., pp. 122-127.

Jason Cong et al., Multilevel Approach to Full-Chip Gridless Routing, 2001 IEEE, pp. 396-403.

(Continued)

*Primary Examiner* — Vuthe Siek
(74) *Attorney, Agent, or Firm* — Alford Law Group, Inc.; Vy H. Vu (57) ABSTRACT

An innovative routing method for an integrated circuit design layout. The layout can include design netlists and library cells. A multiple-level global routing can generate topological wire for each net. An area oriented graph-based detail routing on the design can be performed. A post route optimization after the detail routing can be performed to further improve the routing quality. Some methods can be single threaded all or some of the time, and/or multi-threaded some or all of the time.

29 Claims, 9 Drawing Sheets

U.S. PATENT DOCUMENTS

| | | | |
|---|---|---|---|
| 5,847,965 A | 12/1998 | Cheng | |
| 5,875,117 A | 2/1999 | Jones et al. | |
| 5,877,091 A | 3/1999 | Kawakami | |
| 5,905,669 A | 5/1999 | Horita | |
| 5,930,500 A | 7/1999 | Scepanovic et al. | |
| 5,980,093 A * | 11/1999 | Jones et al. | 716/5 |
| 5,987,086 A | 11/1999 | Raman et al. | |
| 5,990,502 A * | 11/1999 | Park | 257/202 |
| 6,002,857 A | 12/1999 | Ramachandran | |
| 6,027,479 A | 2/2000 | Alei et al. | |
| 6,175,950 B1 | 1/2001 | Scepanovic et al. | |
| 6,205,570 B1 * | 3/2001 | Yamashita | 716/113 |
| 6,230,304 B1 | 5/2001 | Groeneveld et al. | |
| 6,249,902 B1 | 6/2001 | Igusa et al. | |
| 6,269,469 B1 | 7/2001 | Pavisic et al. | |
| 6,289,495 B1 | 9/2001 | Raspopovic et al. | |
| 6,305,004 B1 | 10/2001 | Tellez et al. | |
| 6,324,674 B2 | 11/2001 | Andreev et al. | |
| 6,353,918 B1 | 3/2002 | Carothers et al. | |
| 6,415,427 B2 | 7/2002 | Nitta et al. | |
| 6,651,232 B1 | 11/2003 | Pileggi et al. | |
| 7,036,101 B2 | 4/2006 | He et al. | |
| 7,065,729 B1 * | 6/2006 | Chapman | 716/13 |
| 2001/0018759 A1 | 8/2001 | Andreev et al. | |

FOREIGN PATENT DOCUMENTS

| | | |
|---|---|---|
| JP | 05-012382 | 1/1993 |
| JP | 5067178 | 3/1993 |
| JP | 6045443 | 2/1994 |
| JP | 07-121600 | 12/1995 |
| JP | 10-222549 | 8/1998 |
| WO | WO 00/65489 | 11/2000 |

OTHER PUBLICATIONS

Youn-Long Lin et al. Routing Using A Pyramid Data Structure, 1989 IEEE, pp. 436-439.

Youn-Long Lin et al., Hybrid Routing, Feb. 1990 IEEE, vol. 9, No. 2, pp. 151-157.

Office Action for Japanese Patent app. nNo. 2009-005831; Nov. 11, 2009; pp. 1-15.

Office Action for Japanese Patent app. No. 2002-100659; Feb. 7, 2008; pp. 1-15.

Siek, V; Office Action for U.S. Appl. No. 11/327,226; Sep. 1, 2009; 9 pages.

Siek, V; Office Action for U.S. Appl. No. 11/327,226; Dec. 30, 2008; 8 pages.

Office Action for japanese patent app. No. 2009-005831; Apr. 1, 2009; pp. 1-23.

;Garbowski, L. Office Action for U.S. Appl. No. 10/071,862; Apr. 6, 2006; 10pages.

Clarkson, Kelly L. et al, "Rectilinear Shortest Pathes Throught Polygonal Obstacles", Jan. 1, 1987, pp. 251-257, Publisher: AT&T Bell Laboratories, Published in: New Jersey, USA.

Wu-Ying-Fung et al., "Rectilinear Shortest Paths and Minimum Spanning Trees in the Presence of Rectilinear Obstacles", "Transactions on Computers", Mar. 1, 1987, pp. 321-331, vol. C-36, No. 3, Publisher: IEEE, Published in: US.

Zheng, S.Q. et al., "Finding Obstacle-Avoiding Shortest Paths Using Imlicit Connection Graphs", "Transactions on Computer Aided Design of IC and Sytems", Jan. 1, 1996, pp. 103-110, vol. 15, Publisher: IEEE , Published in: US.

Garbowski, Leigh M. Office Action for U.S. Appl. No. 12/347,832, Mailed Aug. 26, 2011, 9 pages.

* cited by examiner

Graph - Representation

○ Common Node

△ Uncommon Node

Grid - Representation

CONDITIONALLY ROUTING A PORTION OF AN INTEGRATED CIRCUIT DESIGN WITH A DIFFERENT PITCH TO OVERCOME A DESIGN RULE VIOLATION

CROSS-REFERENCE TO RELATED APPLICATIONS

This application claims the benefit and is a divisional of U.S. patent application Ser. No. 10/071,862, filed Feb. 7, 2002 by Limin He et al, entitled METHOD AND APPARATUS FOR SCALABLE INTERCONNECT SOLUTION, now U.S. Pat. No. 7,036,101, which claims the benefit of U.S. Provisional Application No. 60/271,515, filed Feb. 26, 2001, which is hereby incorporated herein by reference.

FIELD

This invention relates generally to the field of microelectronic integrated circuits. In particular, this invention relates to routing of the integrated circuits design.

BACKGROUND

An integrated circuit (IC) comprises cells of similar and/or various sizes, and connections between the cells. A cell includes several pins interconnected by wires to pins of one or more other cells. A net includes a set of pins connected by wires in order to form connections between the pins. A set of nets, called a netlist, defines the connections of an IC.

A router reads in the netlist of an IC, then generates wires, interconnecting pins of nets in the netlist. Once the nets in the netlist are connected, the IC will function correctly. However, due to the large number of nets in the netlist, it typically takes a long time for conventional routers to finish the connection task. In addition, the connections may be too numerous and/or overcrowded, such that conventional routers fail to finish the routing, particularly generating interconnections, without creating one or more design rule violations.

Many of these problems result from the strict adherence of routers to a grid representation of nodes with a uniform structure from layer to layer, and from routing the entire IC design at the same time. Such routers demand excessive amounts of memory and/or take a very long time to route the IC design.

SUMMARY OF INVENTION

Some embodiments of the present invention provide a routing method which can handle very large IC designs in a shorter amount of time and/or a smaller amount of memory. Some embodiments of the present invention can be integrated smoothly into existing IC design flows through standard interface formats and therefore significantly reduce the cost for users.

In a traditional global router, the entire IC design routing task was considered and therefore requires a large amount of memory and run time. In the multi-level Global router, the entire IC design can be divided into multiple levels of hierarchy defined in some embodiments of the present invention. At any one moment, only a portion of the design is processed therefore the present method requires much less memory and run time. In addition, since the routing task has been divided, the multi-threaded parallelism can be applied to speed up the global router. Other embodiments can be single threaded all or some of the time, and/or multi-threaded some of the time.

Some embodiments employ a very compact and efficient representation for the detail router, called graph based representation. The graph-based representation significantly reduces the amount of memory and the amount of search space needed for some embodiments of the router.

In one embodiment, an IC design is accessed. The IC design includes objects on one or more layers. Levels are formed. The levels can include a first level, a second level, and a third level. The first level represents the IC design at a first grid density. The second level represents the IC design at a second grid density. The second grid density is finer than at least the first grid density. The third level represents the IC design at a third grid density. The third grid density is finer than at least the first grid density and the second grid density. Based at least partly on the IC design, each level is populated with the objects. The objects are interconnected at one or more of the first level, the second level, and the third level.

In one embodiment, an IC design is accessed. The IC design includes objects on one or more layers. A first level for the IC design is accessed. The first level of the IC design is partitioned into a first group of one or more partitions. The objects of the IC design are among the first group of one or more partitions. A second level for the IC design is formed. The second level is partitioned into a second group of partitions. One or more partitions of the group of partitions is represented by at least two partitions of the second group of partitions. Within each partition of the second group of partitions, objects are interconnected substantially independently of other partitions of the second group of partitions.

In one embodiment, an IC design is accessed. The IC design includes objects on one or more layers. A first level for the IC design is accessed. The first level of the IC design is partitioned into a first group of one or more partitions. The objects of the IC design are among the first group of one or more partitions. A second level for the IC design is formed. The second level is partitioned into a second group of partitions. One or more partitions of the first group of partitions is represented by at least two partitions of the second group of partitions. The second group of partitions are allotted among a group of areas. Each area of the group of areas includes one or more partitions of the second group of partitions. Within each area of the group of areas, objects are interconnected substantially independently of other areas of the group of areas.

In one embodiment, an IC design is accessed. The IC design includes a group of blockages and a group of pins. A graph is formed. The graph included a first group of nodes. Each node of the first group of nodes is formed outside every blockage of the group of blockages. The group of pins is interconnected through nodes of the graph.

In one embodiment, a first group of nodes is formed for positioning objects of the IC design in a first layer. At least two nodes of the first group of nodes are spaced apart by a first interval. A second group of nodes is formed for positioning objects of the IC design in a second layer. At least two nodes of the second group of nodes are spaced apart by the first interval. At least two nodes of the second group of nodes are spaced apart by one or more intervals greater than the first interval.

In one embodiment, a first group of nodes is formed for positioning objects of the IC design in a first layer. At least two nodes of the first group of nodes are spaced apart by a first interval. A second group of nodes is formed for positioning objects of the IC design in a second layer. At least two nodes of the second group of nodes are spaced apart by the first interval. At least two nodes of the second group of nodes are spaced apart by one or more intervals less than the first interval.

In one embodiment, a first group of nodes is formed for positioning objects of the IC design in a first layer. The first group of nodes includes a first group of common nodes and a first group of uncommon nodes. A second group of nodes is formed for positioning objects of the IC design in a second layer. The second layer is at least substantially parallel to the first layer. The second layer is spaced apart from the first layer by about a layer distance along a layer axis. The second group of nodes includes a second group of common nodes. The first group of common nodes and the second group of common nodes share positions. If the second group of common nodes were shifted toward the first group of common nodes by about the layer distance along the layer axis, the first group of common nodes and the second group of common nodes would be substantially identical. If the second group of common nodes were shifted toward the first group of uncommon nodes by about the layer distance along the layer axis, no node of the first group of uncommon nodes and no node of the second group of common nodes would be substantially identical.

In one embodiment a volume of the IC design is defined. A subset of the volume carries wiring. A group of nodes is formed in the volume. Nodes of the group of nodes are limited to being formed within the subset of the volume.

In one embodiment, one or more routing pitches of one or more layers of the IC design is accessed. A volume of the IC design is defined. A subset of the volume carries wiring. A first group of nodes is formed in the volume. A second group of one or more nodes is formed outside the volume. At least one node of the second group of one or more nodes is formed at a pitch greater than at least one of the one or more routing pitches.

In one embodiment, a first cell instance of the IC design is accessed. A second cell instance of the IC design adjacent to the first cell instance is accessed. The first cell instance and the second cell instance are spaced apart by a channel. A first node is formed near a first end of the channel. A second node is formed near a second end of the channel. A wire is connected directly between the first node and the second node.

In one embodiment, one or more routing pitches of one or more layers of the IC design is accessed. A first cell instance of the IC design is accessed. A second cell instance of the IC design adjacent to the first cell instance is accessed. The first cell instance and the second cell instance are spaced apart by a channel. A group of one or more nodes is formed in the channel. The group of one or more nodes in the channel has a pitch greater than at least one of the one or more routing pitches.

In one embodiment, an IC design is accessed. The IC design includes a group of objects. A group of routing algorithms is accessed. One or more of the group of objects is interconnected with a first group of interconnections at least partly in response to a first combination of one or more routing algorithms of the group of routing algorithms. The first group of interconnections is stored. A second combination of one or more routing algorithms is automatically determined. One or more of the group of objects is interconnected with a second group of interconnections, at least partly in response to the second combination of one or more routing algorithms of the group of routing algorithms. Results of the first group of interconnections and the second group of interconnections are compared. If results of the second group of interconnections are worse than results of the first group of interconnections, the first group of interconnections is restored.

In one embodiment, at least a first portion of the IC design is interconnected at a first routing pitch. If the interconnecting results in one or more design rule violations, at least a part of the first portion of the IC design is routed at a second routing pitch less than the first routing pitch. In one embodiment, at least a first part of the IC design is interconnected on at least a first thread. At least a second part of the IC design is interconnected on at least a second thread.

Other embodiments include not only the software, electrical circuit and/or other circuit performing the methods, but one or more of an integrated circuit made at least partly with the software or circuit, a hardware product such as a computer, server, or router including one or more parts made at least partly with the software or circuit or performing the method.

DETAILED DESCRIPTION OF THE INVENTION

The following detail description is provided to illustrate specific embodiments and is not in any way limiting the scope of the current invention. Various modifications and adjustments are possible within the scope of this invention.

Innovative routing methods for an integrated circuit design layout are disclosed. The integrated circuit design layout can include design netlists and library cells. A multiple-level global routing can generate a topological wire for each net. An area oriented graph-based detailed routing on the integrated circuit design layout can be performed. A post route optimization can be performed after the detailed routing to further improve the routing quality of the integrated circuit design layout. The routing methods may be single threaded all or some of the time, and/or multi-threaded some or all of the time.

Figure 1:
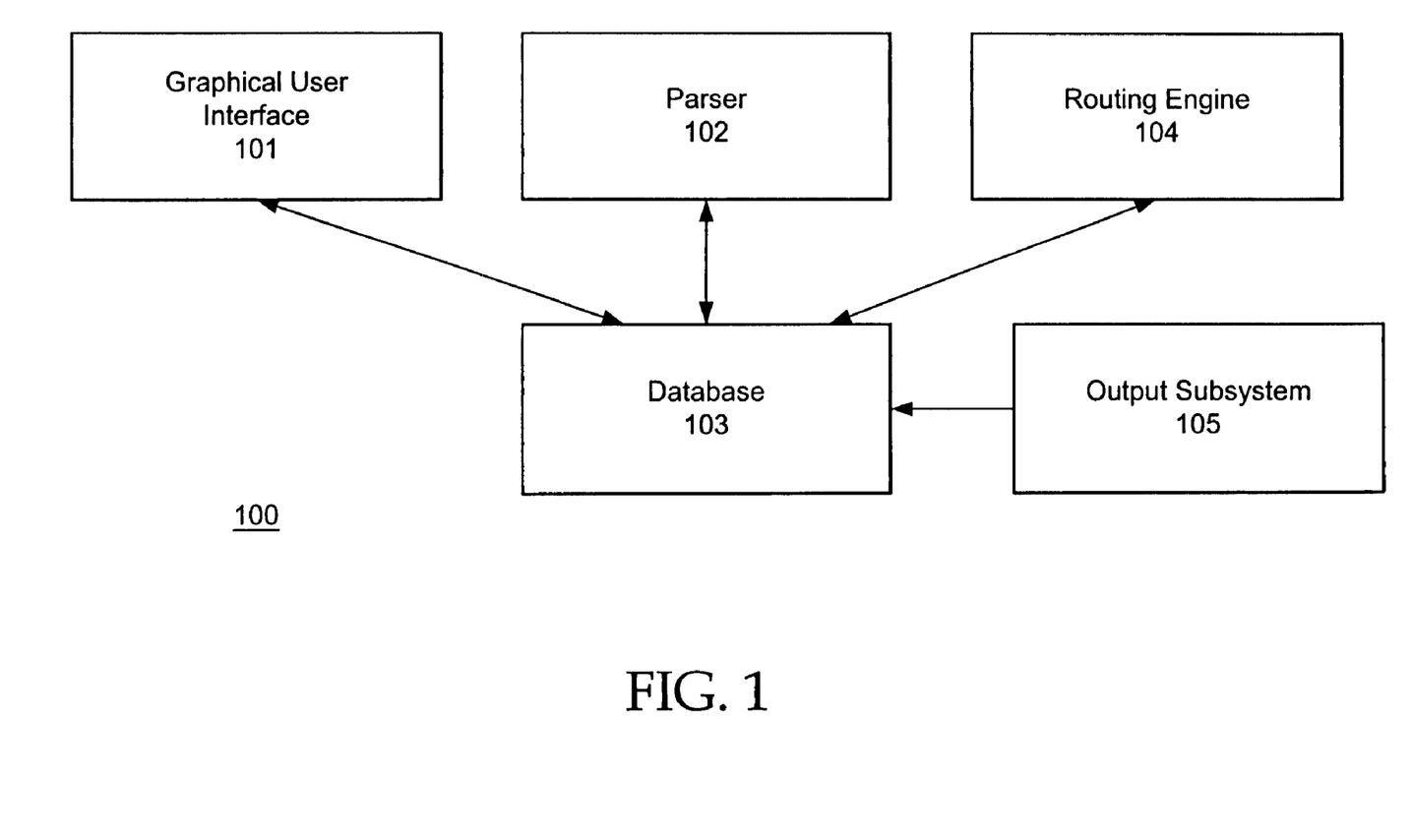
FIG. 1 is an overview of embodiments of router systems.

FIG. 1 shows one embodiment of a router. A router 100 comprise a graphical user interface (GUI) 101 which provides user interactions; a database 103; a parser 102 in one or more formats, standard and/or custom, for storage into the database 103 of IC design information including cells' physical information such as pins and blockages; a routing engine 104 generating wires (which are then stored in the database 103) that interconnect the nets of an IC design; and an output subsystem 105 which outputs the wiring and other useful information into files of standard and/or custom format.

The graphical user interface 101 allows a user to view the wires generated by the router. It also lets the user view various information, such as routing tracks, etc. It also allows the user to interactively add and delete wires, etc. Format file parser and output 102 reads in IC design information stored in a format, such as an industry standard format and/or custom format. The cells and connections are entirely or partly described in the files. Once some embodiments of the present invention finish routing, the generated wires will be output into the files as well. Database 103 stores the IC design information as well as wires in a compact and efficient manner. The routing engine 104 generates wires to realize the connections in the netlist of the IC design.

Figure 2:
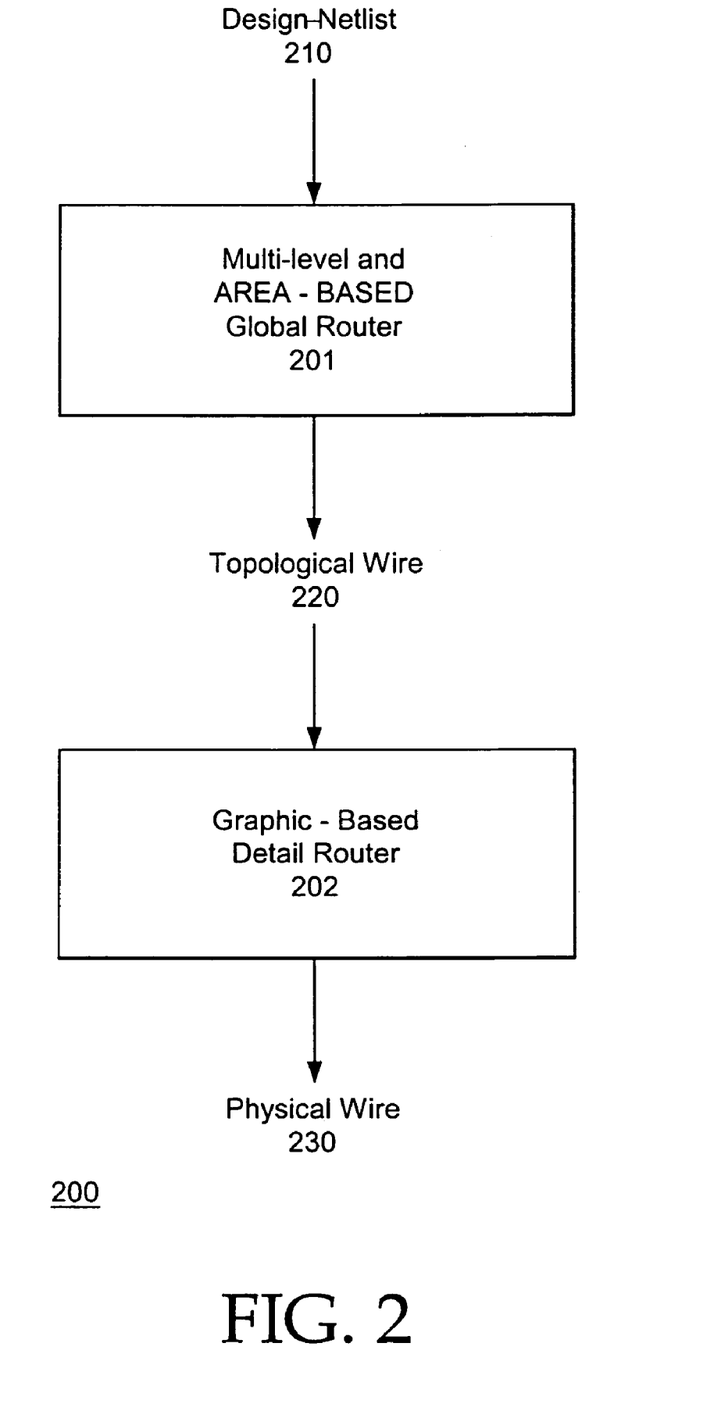
FIG. 2 illustrates the subsystems of the routing engine.

Referring now to FIG. 2, subsystems of a routing engine 200 are illustrated. The routing engine 200 comprises a multi-level area-based global router 201 and a graph-based detail router 202. Some embodiments of the multi-level global router 201 construct multiple levels each with a global routing grid covering the entire IC design of one or more layers. The global router 201 receives a design netlist 210. At any one moment, only a portion, such as an area of one or more partitions, of the design is routed; therefore much less memory and run time are required. Some embodiments route portions having a size of a partition. In addition, since the routing task has been divided, multi-threaded parallelism can be applied to speed up the global router 201. At this stage, the global router 201 generates topological wiring 220, which is passed on to the detail router 202. To generate the physical wires 230 which realize the topological wiring 220, the detail router 202 routes the complete design by dividing the entire design into a set of smaller areas and/or partitions. The detail router 202 can route these areas in parallel utilizing the multi-threaded parallel computing capability of some embodiments of the present invention. Other embodiments can be single threaded all or some of the time, and/or multi-threaded all or some of the time.

Figure 3:
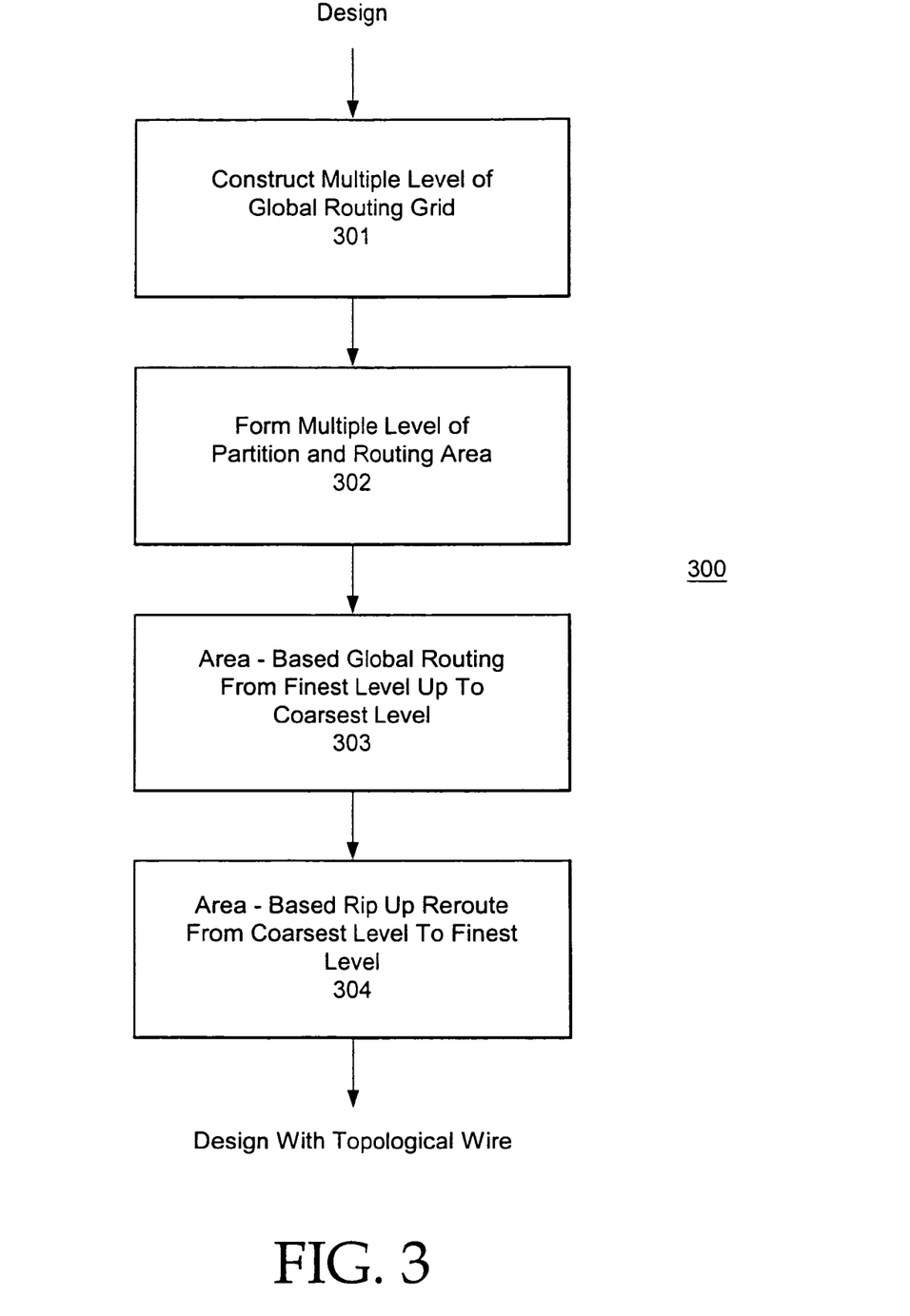
FIG. 3 illustrates a multi-level area-based global router.

FIG. 3 further illustrates an embodiment of a multi-level area-based global router performing a number of steps 300. Step 301 constructs several levels of the global routing grid. After the multi-level global routing grid is formed, step 302 creates multiple partitions and areas at each level. Step 303 performs area-based routing from the finest to the coarsest level. In some embodiments, after step 303, all the nets in the design are routed. In other embodiments, not all the nets in the design are routed after step 303. Step 304 performs area-based rip up rerouting from the coarsest to the finest level. Some embodiments can mix the order of part or all of step 301, step 302, step 303, and step 304, and/or perform part or all of step 301, step 302, step 303, and step 304 once or multiple times.

Figure 4:
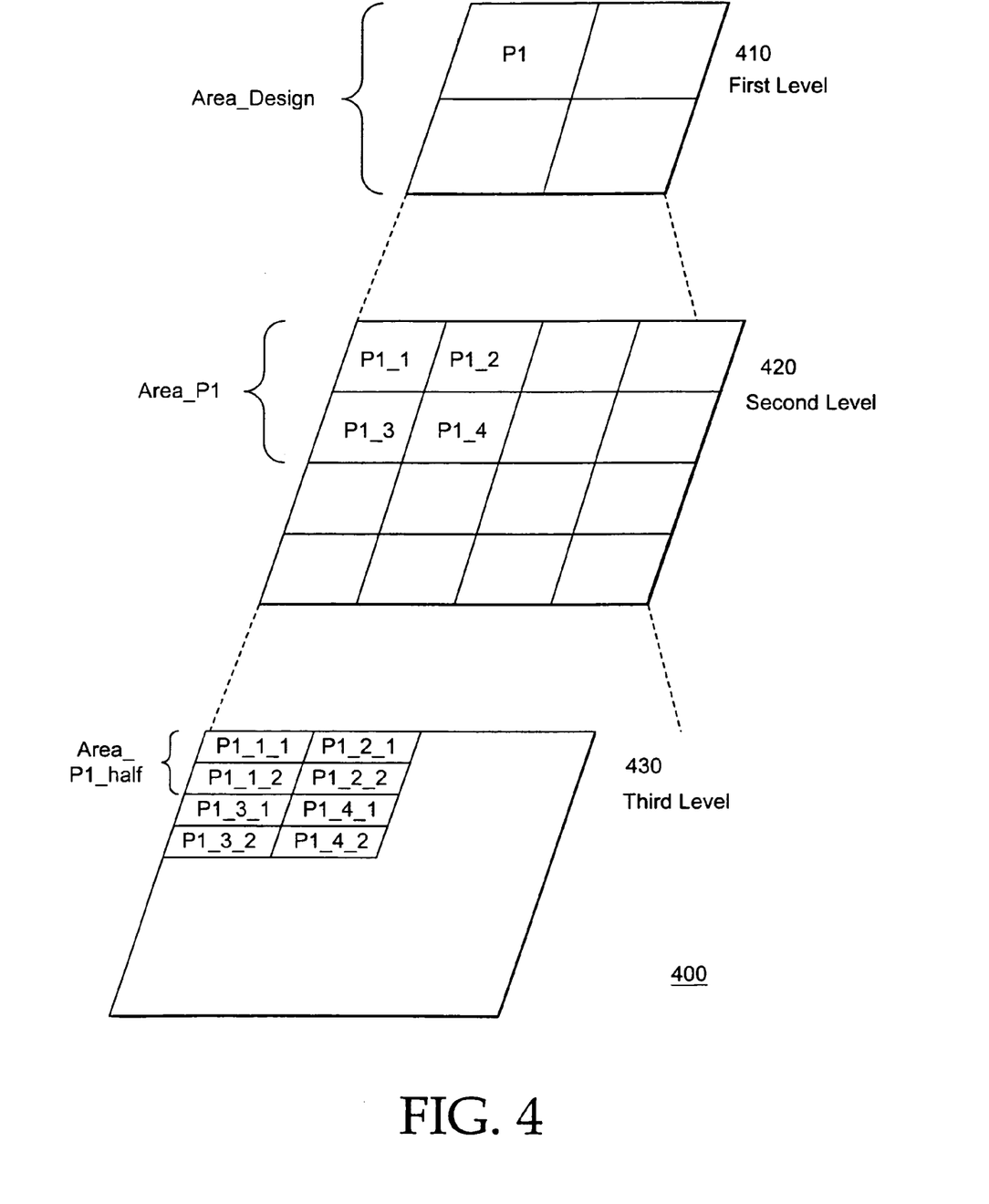
FIG. 4 illustrates a multi-level global routing grid.

FIG. 4 illustrates an example of the multi-level global routing grid 400. In FIG. 4, at the first level 410, the entire design is divided into a "2 by 2" partitioned global routing grid. P1 denotes a partition formed by this "2 by 2" global routing grid. At the second level 420, the global routing grid is a finer version of the first level global routing grid. For example, the P1 partition can be further divided into e.g., four partitions (i.e. P1_1, P1_2, P1_3, P1_4) at the second level 420. In a similar way, the global routing grid of the third level 430 is formed and each partition at the second level 420 is further divided into partitions at the third level 430. For example, partition P1_1 is divided into partition P1_1 and partition P1_1_2. Some global routers use only one level of the global routing grid. Some embodiments use multiple levels of the global routing grid. The shown embodiment has three levels, and other embodiments have a different number of levels, such as two levels, four levels, or more levels. Other embodiments can be single threaded all or some of the time, and/or multi-threaded some or all of the time.

The number of levels of this hierarchical global routing grid is decided based on the design size. When the design size becomes larger, the number of levels can increase. In addition, the degree of refinement of the global routing grid between two consecutive levels can differ. For example, partition P1 of the first level 410 becomes 4 partitions (i.e. P1_1, P1_2, P1_3, P1_4) at the second level 420. The partition P1_1 of the second level 420 can be divided into 2 partitions (i.e., P1_1_1, P1_1_2) at the third level 430.

In some embodiments, a grid is divided into partitions such that all partitions have the same size and shape. In other embodiments, a grid is divided into partitions such that at least two partitions have different sizes and or shapes.

In some embodiments, each partition at a coarser level is divided into a same number of partitions all having the same shape at a finer level. In other embodiments, at least two partitions at a coarser level are divided into a different number of partitions at a finer level. In other embodiments, at least one partition at a coarser level is divided into a number of partitions having at least two different shapes at a finer level. In other embodiments, at least one partitions at a coarser level is not further divided into multiple partitions at a finer level.

At the first level 410, we can form one area to cover the entire design. Other embodiments can form multiple areas to cover the first level 410. Then at the second level 420, we can form an area (Area_P1) containing partitions P1_1, P1_2, P1_3, and P1_4. Three more areas of similar size can be formed to cover the entire design at the second level. Other embodiments can divide a level into another number of areas, allocate a different number of partitions into each area, and/or allocate a different number of partitions into each area. We can also form area at the third level. For example, Area_P1_half contains four partitions $P1_{\_1}\_1$, P1_1_2, P1_2_1, and P1_2_2. Similarly other areas can be formed and together these areas cover the whole design at the third level. Some prior art global routers are limited to performing global routing of the whole design. Various embodiments of the global router can also perform global routing in the whole design, and/or perform global routing in an area.

After the areas of each level are formed, the global router will create initial wiring by routing the areas of the third level 430 first. If a net completely resides inside an area of the third level 430, then it will be routed. Otherwise, it will not be routed. The global router then moves to the areas of the second level 420 and routes the unrouted nets residing in the area. Finally, it moves to the single area of the first level 410 and routes the unrouted nets in the area. In other embodiments, the global router can create initial wiring in one or more levels other than the finest level, and/or move from a coarser level to a finer level.

Routing quality can be further improved by rip up rerouting. In an example of the multi-level global routing grid 400, rip up rerouting can start from the second level. Other embodiments can start from another level. For each area in the second level, the global router can reroute the nets in the area to further improve the routing quality. Then it will move down to the third level and reroute each area at the third level. In other embodiments, rip up rerouting can move from a finer level to coarser level, and start from another level besides the second level.

During initial and/or rip up routing for each level, there are multiple areas and these areas can be routed independently subject to two conditions. First, when routing an area, for nets which have pins or wires in other areas, the boundary locations of the net along the four edges of the area will be honored. By doing so, a net's wiring in different areas can be connected properly. Second, two different areas sharing the same net can be routed independently but cannot be updated to the wiring database at the same time. A synchronization mechanism can ensure that the shared net in different areas will not be updated at the same time. Some embodiments use the multi-threaded mechanism provided by the computer operating system to route all, or multiple, areas in parallel. The number of areas that get routed at the same time depends at least partly on the number of Central Processing Units (CPU) that are available. To handle the shared nets between Areas A and B, a locking mechanism can ensure synchronization. For example, when the shared net is routed by Area A, then Area A will lock the shared net before updating the net. Then Area B will not update the shared net when it sees that the shared net has been locked. Other embodiments can be single threaded all or some of the time, and/or multi-threaded some of the time.

Figure 5:
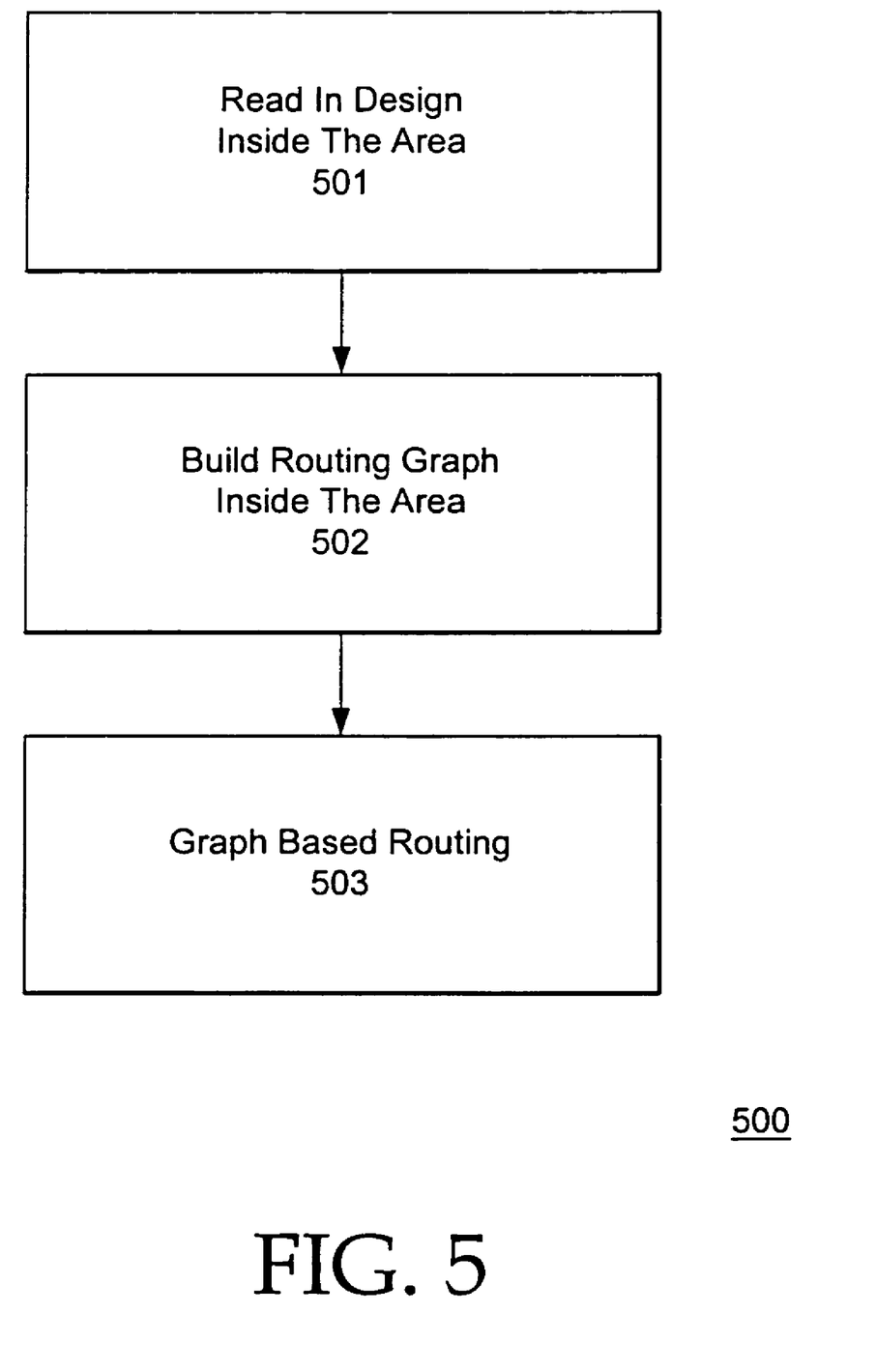
FIG. 5 illustrates an area oriented graph based detail router.

FIG. 5 depicts an embodiment of the area-oriented, multi-threaded graph-based detail router 500. In the detail router of some embodiments of the present invention, a design is routed by dividing the entire design into a set of smaller shapes such as polygons. An example of a polygon is a rectangle. These shapes can be routed in parallel utilizing the multi-threaded parallel computing capability of some embodiments of the present invention. Other embodiments can be single threaded all or some of the time, and/or multi-threaded some of the time.

First, step 501 reads in the design information inside an area relevant to the detail router 500. For example, it can read in the cells, pins, netlist, and the global routing within the area, etc. Then step 502 can build a routing graph representation which can support efficient routing. After the routing graph is built, a fast graph search algorithm can be used in step 503 to find the routing paths which interconnect pins of nets. Other embodiments can be single threaded all or some of the time, and/or multi-threaded some of the time.

Once the efficient routing graph is built, we then perform graph based routing step 503. Graph based routing includes a set of heuristic graph search algorithms. It emphasizes speed and the ability to a finish a design that is hard to route. Since the routing quality of a heuristic algorithm greatly depends on the IC design characteristics, some embodiments of the present invention have several heuristic algorithms. The main algorithm handles the main routing task. After the main algorithm finishes the routing, it enters the post route optimization phase. In this phase, several different heuristic algorithms are applied. Each algorithm is targeted at one or more certain design characteristics. In this phase if the design's characteristics don't fit the algorithm, then the routing result could become worse. If the situation is not corrected, the design will not be routed without violations.

The run time and memory efficiency of any router greatly depends on the routing representation. Some routers for large IC designs typically choose to build a routing grid representation. The simplicity of the routing grid representation makes the implementation of the router easier. However, the routing grid representation can't accommodate some recent IC design requirements. Thus some embodiments of the present invention choose a more general graph representation for routing rather than the simple grid representation. A grid representation can have a strict uniform structure. However, some embodiments with a routing graph representation don't have this limitation, and can use a routing graph representation and/or a routing grid representation. This flexibility can reduce the memory requirements and/or run time. The following shows the graph representation of some embodiments of the present invention.

Figure 6:
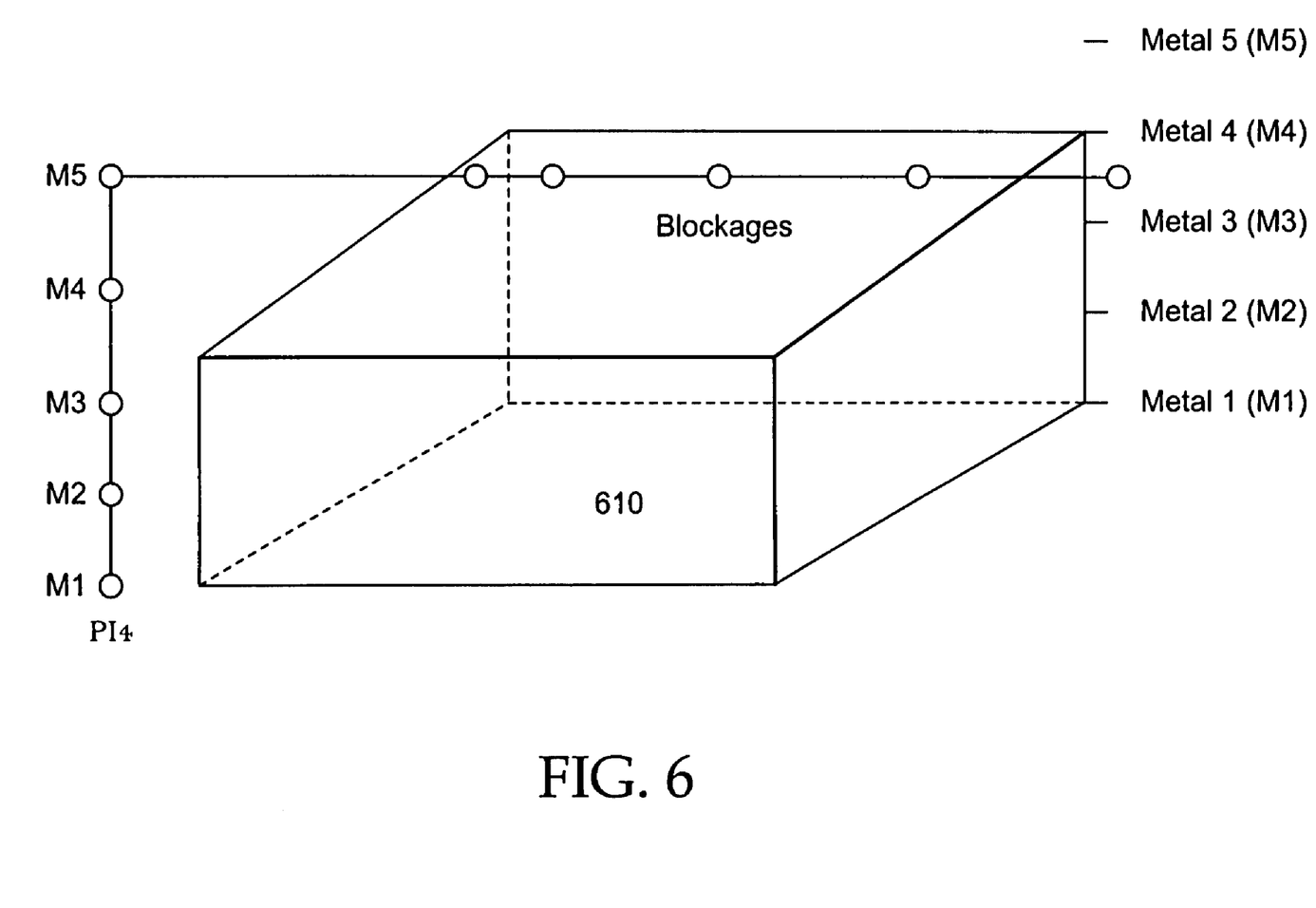
FIG. 6 illustrates a graph representation avoiding or decreasing nodes on blockages.

FIG. 6 illustrates a graph representation in a given routing area avoiding or decreasing nodes on blockages. Five metal wire routing layers, metal 1, metal 2, metal 3, metal 4, and metal 5, are illustrated for interconnecting graph nodes in the given routing area.

In FIG. 6, there is a big blockage 610 inside the routing area. In grid based routing, the entire area would be covered by a grid, regardless of the fact that there exists a big blockage. This is due to the uniform structure requirement of the grid representation. In a graph representation, FIG. 6 shows that we can construct graph nodes for the empty space unoccupied by the blockage 610, without creating graph nodes for the blockage. The resulting graph has fewer nodes since much of the space is occupied by the blockage 610. By using the graph representation, the number of graph nodes is much smaller than the number of grids and therefore has a significant memory reduction compared to a grid representation. In addition, the graph-based routing algorithm has fewer nodes to traverse and hence reduce significant CPU time. In other embodiments, the number of nodes in or around a blockage is at least reduced compared to a grid representation, without reducing the number of nodes in or around the blockage to zero.

Figure 7:
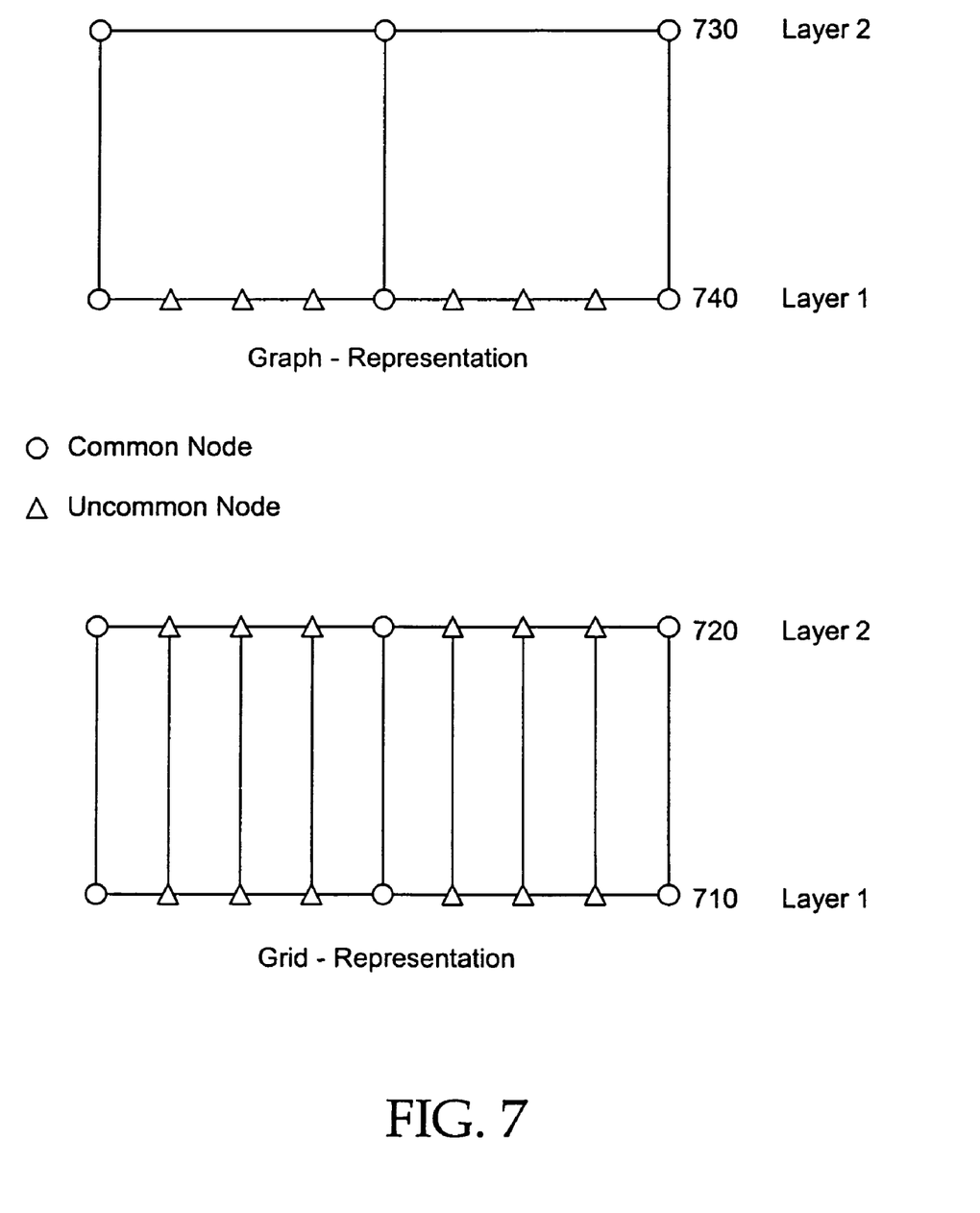
FIG. 7 illustrates a difference between graph representation and grid representation.

FIG. 7 uses an example to contrast the differences between the graph representation and the grid representation. A typical situation in a design is that the pin shape is very complex. For a grid-based router to address the issue, it will need to create many extra "access grids" on the pin layer to finish the routing. With a grid based router, due to the uniform structure requirement of the grid, these access grids will be present at other routing layers as well. Therefore, the memory requirement increases significantly. Shown in FIG. 7, many triangle shapes (uncommon) nodes are created at layer 1, 710, due to the pins. In grid representation, due to the uniform structure requirement, layer 2, 720, must have those triangle nodes as well. By using the graph representation, we can have many "access graph nodes" at layer 1, 740, and still keep very few graph nodes at layer 2, 730. The common nodes of layer 1, 740, and layer 2, 730, have the same structure. This way, the memory as well as routing time can be reduced. In other embodiments, common nodes of different layers can have at least partly different structure.

Figure 8:
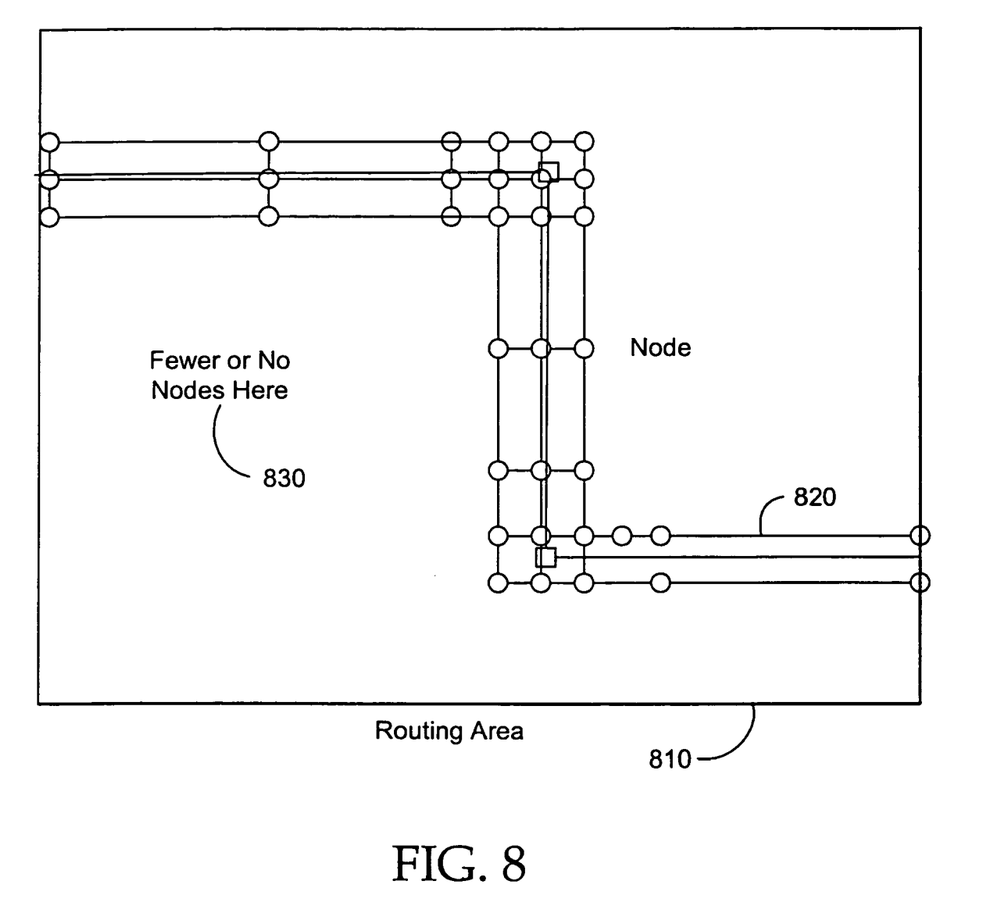
FIG. 8 illustrates the graph representation surrounding a wire.

FIG. 8 shows a global routed wire in a routing area 810. In traditional grid based routing, the router creates a routing grid to cover the whole area. In our graph representation, we can create only graph nodes in an area surrounding the global route wires 820. For the rest of the area 830, there are no graph nodes at all. For example, in FIG. 8, some embodiments of the present invention create only a few nodes surrounding the wires. This capability allows us to reduce the memory and run time significantly. In other embodiments, some graph nodes are created in the portion of the area beyond the surrounding of the global route wires, but at a lower density than in the surrounding of the global route wires. In addition, if the global routing wire only routes within certain layers, graph nodes only need to be created in those layers. All the other layers will not have graph nodes. In other embodiments, one or more graph nodes are created in one or more of the other layers.

Figure 9:
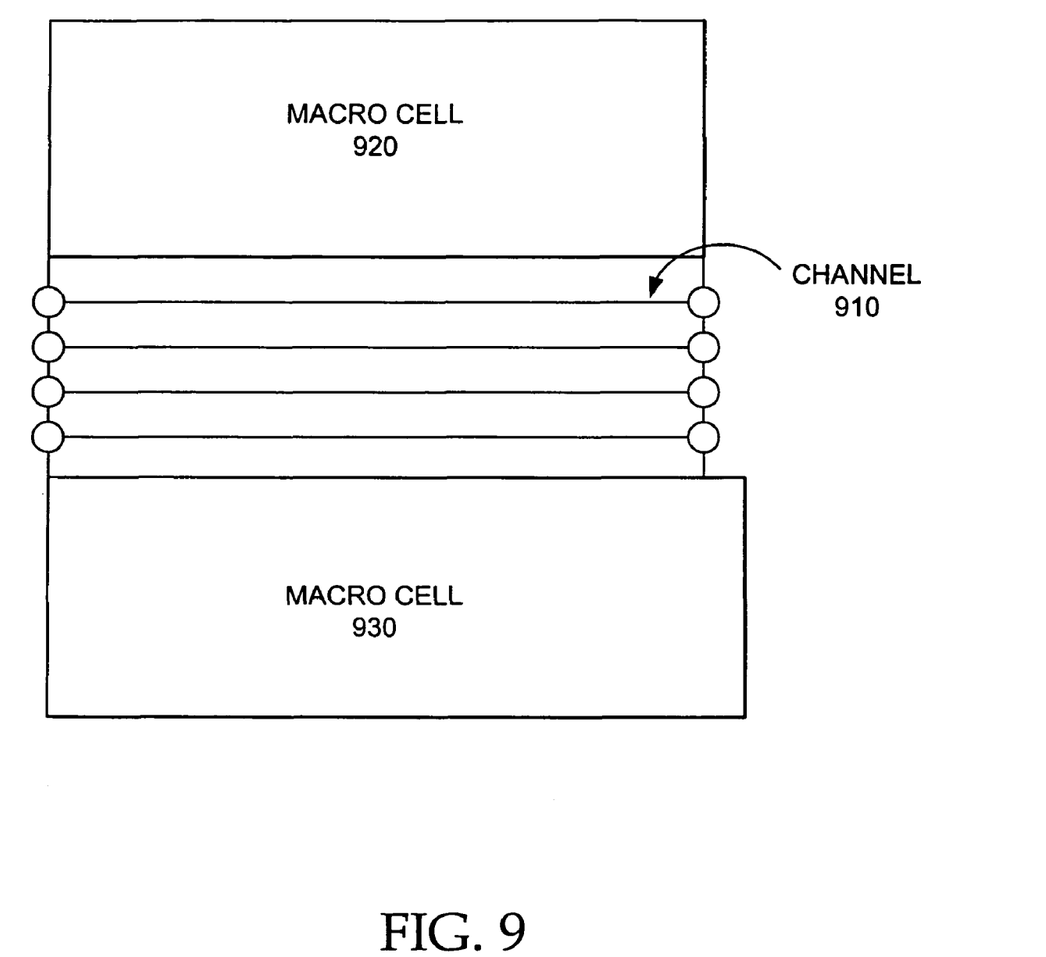
FIG. 9 illustrates the graph representation for a channel.

FIG. 9 shows a channel structure 910 between two Macro cells 920 and 930. If the global routing wire within the channel 910 are straight, then we can simply create two graph nodes, one at or by the left entrance and one at or by the right entrance, for one or more of the routing tracks. With this graph structure, the memory and run time are significantly reduced. In contrast, the grid based router must generate lots of grid based on the routing pitch of a layer. Therefore, it will generate lots of grids regardless of the fact that the channel structure exists and global routing wires are straight. When the global routing wire is not straight, a few more nodes inside the channel can be added to facilitate the routing. Essentially, the idea illustrated in FIG. 9 can be used to add more or less nodes into the channel area. Other embodiments can place one or more nodes in the channel at a density less than the routing pitch.

A set of nodes can have more than one routing pitch. For example, a set of three nodes can have one routing pitch between the first node and the second node, and another routing pitch between the second node and the third node. A set of one node has a routing pitch of infinity.

Some embodiments of the invention have a mechanism to store the best routing result so far. If applying a new heuristic algorithm to the best routing solution results in a worse result, the best routing solution can be restored. Then another heuristic algorithm is applied to the best solutions. If the result is better, it can be updated to become the best solution. This way, the routing result can become better and not worse in the post route optimization phase.

Some embodiments interconnect at least a first portion of the IC design at a first routing pitch. If interconnecting results in one or more design rule violations, at least a part of the first portion of the IC design is routed at a second routing pitch differing from and maybe greater than or less than the first routing pitch.

What is claimed is:

1. A method of routing an integrated circuit (IC) design, comprising:
    with one or more central processing units,
        dividing the IC design into multiple levels of hierarchy;
        at any one moment, interconnecting a first portion of the IC design by routing first metal wires having a first routing pitch;
        in response to the interconnecting with the first metal wires resulting in one or more layout design rule violations, routing at least a part of the first portion of the IC design with second metal wires having a second routing pitch;
    wherein the second routing pitch of the second metal wires is different than the first routing pitch of the first metal wires; and
    wherein the second routing pitch is not pre-set.

2. The method of claim 1, wherein
the routing is multithreaded at least at a first time.

3. The method of claim 1, wherein
the routing is single threaded at least at a first time.

4. The method of claim 1, wherein
the part of the first portion of the IC design routed at the second routing pitch different than the first routing pitch includes
    a part of the IC design causing at least one of the one or more layout design rule violations.

5. The method of claim 1, wherein
the second routing pitch is less than the first routing pitch.

6. The method of claim 1, wherein
the second routing pitch is greater than the first routing pitch.

7. The method of claim 1, wherein
the interconnecting of the at least first portion of the IC design is through at least two metal routing layers.

8. The method of claim 7, wherein
a first metal routing layer having the first routing pitch is routed as the first metal wires, and
a second metal routing layer having the second routing pitch differing from the first routing pitch is routed as the second metal wires.

9. The method of claim 8, wherein
the second routing pitch is less than the first routing pitch.

10. The method of claim 9, wherein
a minimum spacing of the first metal layer and the second metal layer is substantially the same, and
a second minimum width of the second metal layer is less than a first minimum width of the first metal layer.

11. The method of claim 9, wherein
a minimum width of the first metal layer and the second metal layer is substantially the same, and
a second minimum spacing of the second metal layer is less than a first minimum spacing of the first metal layer.

12. The method of claim 8, wherein
the second routing pitch is greater than the first routing pitch.

13. The method of claim 12, wherein
a minimum spacing of the first metal layer and the second metal layer is substantially the same, and
a second minimum width of the second metal layer is greater than a first minimum width of the first metal layer.

14. The method of claim 12, wherein
a minimum width of the first metal layer and the second metal layer is substantially the same, and
a second minimum spacing of the second metal layer is greater than a first minimum spacing of the first metal layer.

15. A method of routing an integrated circuit (IC) design, comprising:
    with one or more central processing units,
        dividing the IC design into multiple levels of hierarchy;
        at any one moment, routing a first portion of an integrated circuit design with first metal wires having a first routing pitch;
        routing a second portion of the integrated circuit design with second metal wires having a second routing pitch, wherein the second routing pitch of the second metal wires is different from the first routing pitch of the first metal wires and wherein the second routing pitch is not pre-set;
        interconnecting the first portion of the integrated circuit design to the second portion of the integrated circuit design with the first metal wires; and
        in response to one or more layout design rule violations in the interconnecting with the first metal wires, partially interconnecting the first portion of the integrated circuit design to the second portion of the integrated circuit design with the second metal wires.

16. The method of claim 15, wherein
the interconnecting of the at least first portion of the IC design is through at least two metal routing layers including
    a first metal routing layer having the first routing pitch that is routed as the first metal wires, and
    a second metal routing layer having the second routing pitch differing from the first routing pitch that is routed as the second metal wires.

17. The method of claim 16, wherein
a minimum spacing of the first metal layer and the second metal layer is substantially the same, and
a second minimum width of the second metal layer is less than a first minimum width of the first metal layer,
such that the second routing pitch is less than the first routing pitch.

18. The method of claim 16, wherein
a minimum width of the first metal layer and the second metal layer is substantially the same, and
a second minimum spacing of the second metal layer is less than a first minimum spacing of the first metal layer,
such that the second routing pitch is less than the first routing pitch.

19. The method of claim 16, wherein
a minimum spacing of the first metal layer and the second metal layer is substantially the same, and a second minimum width of the second metal layer is greater than a first minimum width of the first metal layer, such that the second routing pitch is greater than the first routing pitch.

20. The method of claim 16, wherein a minimum width of the first metal layer and the second metal layer is substantially the same, and a second minimum spacing of the second metal layer is greater than a first minimum spacing of the first metal layer, such that the second routing pitch is greater than the first routing pitch.

21. A system for routing an integrated circuit (IC) design, comprising:
   one or more processors;
   a computer readable medium coupled to the one or more processors, the computer readable medium including instructions stored therein that when executed by the one or more processors performs functions including
       dividing the IC design into multiple levels of hierarchy;
       at any one moment, interconnecting a first portion of the IC design by routing first metal wires having a first routing pitch;
       in response to the interconnecting with the first metal wires resulting in one or more layout design rule violations, then routing at least a part of the first portion of the IC design with second metal wires having a second routing pitch;
       wherein the second routing pitch of the second metal wires is different than the first routing pitch of the first metal wires; and
       wherein the second routing pitch is not pre-set.

22. The system of claim 21, wherein
the part of the first portion of the IC design routed at the second routing pitch different than the first routing pitch includes
a part of the IC design causing at least one of the one or more layout design rule violations.

23. The system of claim 21, wherein
the interconnecting of the at least first portion of the IC design is through at least two metal routing layers,
a first metal routing layer having the first routing pitch is routed as the first metal wires, and
a second metal routing layer having the second routing pitch differing from the first routing pitch is routed as the second metal wires.

24. The system of claim 23, wherein
the second routing pitch is less than the first routing pitch.

25. The system of claim 24, wherein
a minimum spacing of the first metal layer and the second metal layer is substantially the same, and
a second minimum width of the second metal layer is less than a first minimum width of the first metal layer.

26. The system of claim 24, wherein
a minimum width of the first metal layer and the second metal layer is substantially the same, and
a second minimum spacing of the second metal layer is less than a first minimum spacing of the first metal layer.

27. The system of claim 23, wherein
the second routing pitch is greater than the first routing pitch.

28. The system of claim 27, wherein
a minimum spacing of the first metal layer and the second metal layer is substantially the same, and
a second minimum width of the second metal layer is greater than a first minimum width of the first metal layer.

29. The system of claim 27, wherein
a minimum width of the first metal layer and the second metal layer is substantially the same, and
a second minimum spacing of the second metal layer is greater than a first minimum spacing of the first metal layer.

* * * * *